US006940331B2

United States Patent
Kim (10) Patent No.: US 6,940,331 B2
(45) Date of Patent: Sep. 6, 2005

(54) DELAYED TAP SIGNAL GENERATING CIRCUIT FOR CONTROLLING DELAY BY INTERPOLATING TWO INPUT CLOCKS

(75) Inventor: Chan-Kyung Kim, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/698,383

(22) Filed: Nov. 3, 2003

(65) Prior Publication Data

US 2004/0135612 A1 Jul. 15, 2004

(30) Foreign Application Priority Data

Nov. 5, 2002 (KR) .............................. 10-2002-0068155

(51) Int. Cl.[7] .............................................. H03H 11/26
(52) U.S. Cl. ...................................... 327/270; 327/296
(58) Field of Search ........................ 327/261, 269–270, 327/291, 295, 296, 231, 251

(56) References Cited

U.S. PATENT DOCUMENTS

| 5,986,949 A | * | 11/1999 | Toda ........................... 365/194 |
| 6,052,011 A | * | 4/2000 | Dasgupta .................... 327/270 |
| 6,104,228 A | * | 8/2000 | Lakshmikumar ............ 327/407 |
| 6,191,632 B1 | * | 2/2001 | Iwata et al. ................. 327/295 |
| 6,570,425 B2 | * | 5/2003 | Yamaguchi ................. 327/251 |

FOREIGN PATENT DOCUMENTS

JP        2002232274        8/2002

* cited by examiner

Primary Examiner—Minh Nguyen
(74) Attorney, Agent, or Firm—Volentine Francos & Whitt, pllc (57) ABSTRACT

A circuit and method of generating delayed tap signals can adjust a delay difference by interpolating two input clock signals as indicated by an offset information signal. In the circuit, first and second tap signals are generated by interpolating first and second clock signals in response to the offset information. A delay difference between output tap signals is adjusted by an amount indicated by the offset information. Thus, tap signals having a fine delay difference can be obtained by adjusting the offset information.

20 Claims, 5 Drawing Sheets

DELAYED TAP SIGNAL GENERATING CIRCUIT FOR CONTROLLING DELAY BY INTERPOLATING TWO INPUT CLOCKS

CROSS REFRENCES TO RELATED APPLICATIONS

This application claims priority under 35 U.S.C. §119 from Korean Patent Application No. 2002-68155 filed on Nov. 5, 2002, the contents of which are hereby incorporated by reference in their entirety for all purposes as if fully set forth herein.

BACKGROUND AND SUMMARY

1. Technical Field

The present invention relates to signal generators, and more particularly, to a signal generating circuit for generating a plurality of delayed tap signals.

2. Description

In an output driver of a memory device divided into a plurality of segments, the slew rate of an output signal output to the output driver is adjusted by turning on or turning off each segment at a predetermined interval.

When the operating frequency of a memory device is low, the adjustment of the slew rate of an output signal is not so important. However, as the operating frequency of a memory device becomes higher, an apparatus for adjusting the slew rate of an output signal is required.

To adjust the slew rate of an output signal, which is output to an output driver divided into predetermined segments, a plurality of signals having respective constant delays are needed. Such signals are normally called "delayed tap signals." The delayed tap signals having the respective constant delays are synthesized so as to adjust the slew rate of the output signal output from an output driver.

For example, when four tap signals are used to adjust the slew rate, if delay differences between the tap signals are small, the four tap signals are synthesized to obtain an output signal having a high slew rate. Inversely, if delay differences between the tap signals are large, the four signals are synthesized to obtain an output signal having a low slew rate.

Delayed tap signals may be produced by various methods. For instance, a plurality of inverters having identical delays can be used. That is, outputs of the respective inverters are used as the delayed tap signals. An interval between the tap signals is determined by the delay of an inverter. Also, a plurality of inverters and a plurality of variable delay cells may be utilized to control an interval between output delayed tap signals.

Figure 1:
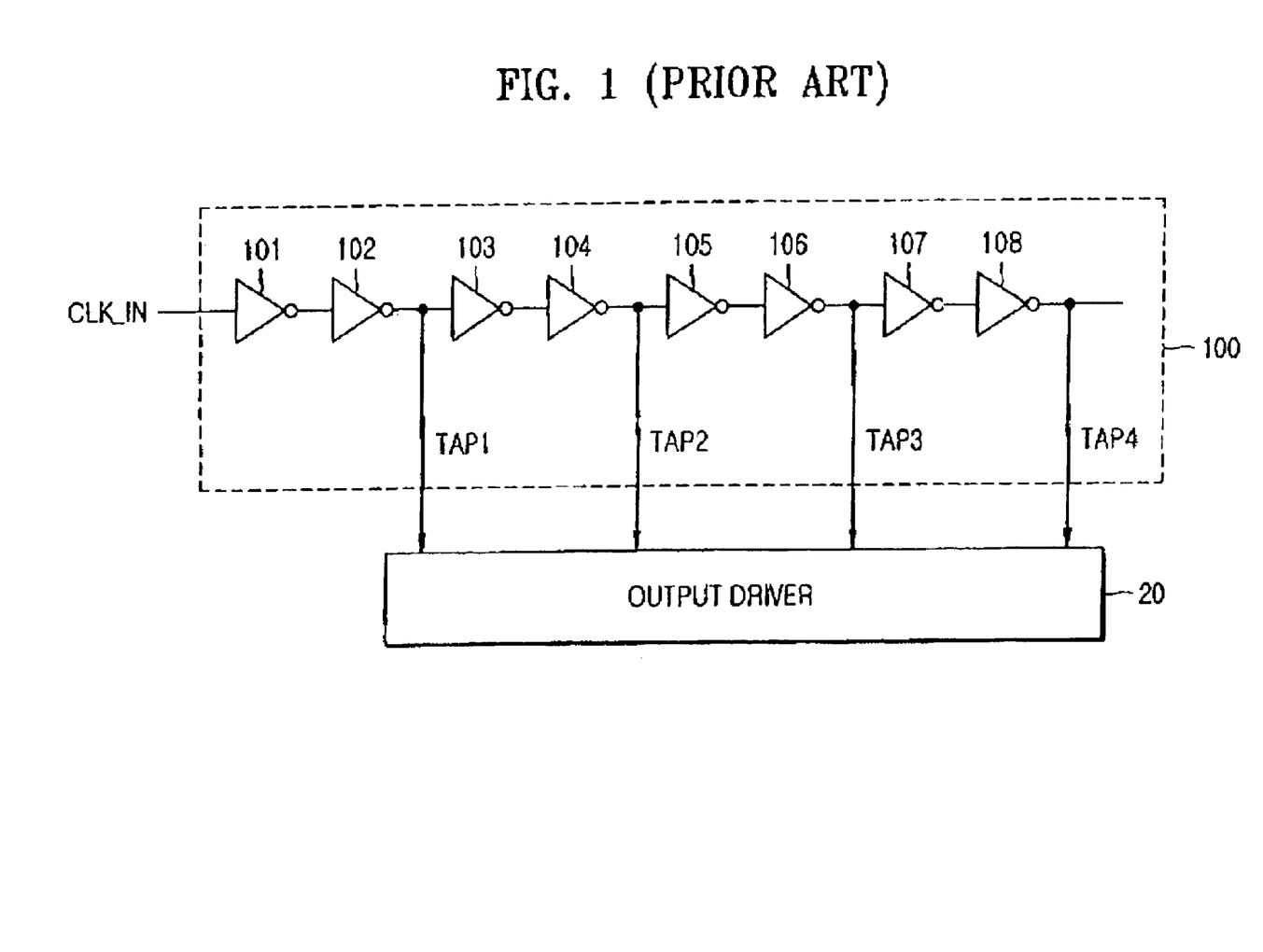
FIG. 1 is a circuit diagram of a conventional delayed tap signal generating circuit using a plurality of inverters.

FIG. 1 is a circuit diagram of a conventional delayed tap signal generating circuit using a plurality of inverters. A tap signal generating circuit 100 of FIG. 1 includes a plurality of inverters 101, 102, 103, 104, 105, 106, 107, and 108, which are connected in series.

The tap signal generating circuit 100 delays an input clock signal CLK_IN by the delays of a series of inverters and produces tap signals TAP1, TAP2, TAP3, and TAP4 at each output of a pair of series-connected inverters. That is, the delay difference between two of the tap signals depends on the delay of an inverter.

For example, when the delay of each of the inverters 101, 102, ..., and 108 as illustrated in FIG. 1 is 50 ps, each delay difference between the tap signals TAP1, TAP2, TAP3, and TAP4 is 100 ps. That is, the delay difference between the tap signals TAP1 and TAP2 is 100 ps, the delay difference between the tap signals TAP2 and TAP3 is 100 ps, and the delay difference between the tap signals TAP3 and TAP4 is 100 ps.

However, in the tap signal generating circuit 100 of FIG. 1, the delay difference between the delayed tap signals is determined by the delay of an inverter. For this reason, a system requiring fine delayed tap signals, in which the required delay difference between tap signals is less than the delay of one inverter, cannot use the tap signal generating circuit 100 of FIG. 1.

Namely, when the delay difference (interval) between delayed tap signals is required to be 20 ps and the delay of one inverter is 50 ps, the tap signal generating circuit of FIG. 1 cannot generate the required delayed tap signals.

The present invention provides a circuit and method of generating delayed tap signals which can meet the required fine delay difference between delayed tap signals.

In accordance with an aspect of the present invention, there is provided a delayed tap signal generating circuit, comprising a first tap signal generating circuit for receiving a first clock signal and a second clock signal, which have the same frequency and a predetermined phase difference, and generating a first tap signal in response to the first and second clock signals and a predetermined offset information, wherein the first tap signal is delayed by a first delay corresponding to the offset information based on the first clock signal; and a second tap signal generating circuit for receiving the first and second clock signals, and generating a second tap signal in response to the first and second clock signals and the offset information, wherein the second tap signal is delayed by the first delay and a second delay added by the first delay based on the first clock signal. The first and second tap signals are generated by interpolating the first and second clock signals in response to the offset information.

Preferably, the first tap generating circuit includes a first N-bit adder for receiving the offset information, converting the offset information into an N-bit digital signal, adding a predetermined default signal to the N-bit digital signal, and outputting the result; a first digital/analog converting circuit for receiving the output signal of the first N-bit adder, converting the output signal of the first N-bit adder into an analog signal and outputting the analog signal; and a first interpolating circuit for receiving the first and second clock signals, interpolating the first and second clock signals in response to the output signal of the digital/analog converting circuit, and outputting the first tap signal.

Preferably, the second tap generating circuit includes a second N-bit adder for receiving the offset information, converting the offset information into the N-bit digital signal, adding the output signal of the first N-bit adder to the N-bit digital signal; a second digital/analog converting circuit for receiving the output signal of the second N-bit adder, converting the output signal of the second N-bit adder into an analog signal, and outputting the analog signal; and a second interpolating circuit for receiving the first and second clock signals, interpolating the first and second clock signals in response to the output signal of the digital/analog converting circuit, and outputting the second tap signal.

In accordance with another aspect of the present invention, there is provided a delayed tap signal generating circuit, comprising a second tap signal generating circuit for generating a second tap signal in response to a first clock signal, a second clock signal, and a predetermined offset information, wherein the second tap signal is delayed by a first delay corresponding to the offset information based on a first tap signal; and a third tap signal generating circuit for receiving the first and second clock signals and generating a third tap signal in response to the first and second clock signals and the offset information, wherein the third tap signal is delayed by the first delay and a second delay added by the first delay based on the first tap signal; and a fourth tap generating circuit for receiving the first and second clock signals and generating a fourth tap signal in response to the first and second clock signals and the offset information, wherein the fourth tap signal is delayed by the second delay and a third delay added by the first delay based on the third tap signal. The first tap signal is the first clock signal, and the second, third, and fourth tap signals are generated by interpolating the first and second clock signals in response to the offset information.

Preferably, the second tap signal generating circuit includes a first N-bit adder for receiving the offset information, converting the offset information into an N-bit digital signal, adding a predetermined default signal to the N-bit digital signal, and outputting the result; a first digital/analog converting circuit for receiving the output signal of the first N-bit adder, converting the output signal of the first N-bit adder into an analog signal, and outputting the analog signal; and a first interpolating circuit for receiving the first and second clock signals, interpolating the first and second clock signals in response to the output signal of the digital/analog converting circuit, and outputting the first tap signal.

In accordance with yet another aspect of the present invention, there is provided a method of generating delayed tap signals, comprising (a) receiving a first clock signal and a second clock signal, which have the same frequency and a predetermined phase difference, and generating a first tap signal in response to the first and second clock signals and a predetermined offset information, wherein the first tap signal is delayed by a first delay corresponding to the offset information based on the first clock signal; (b) receiving the first and second clock signals and generating a second tap signal in response to the first and second clock signals and the offset information, wherein the second tap signal is delayed by the first delay and a second delay added by the first delay based on the first clock signal. Here, the first and second tap signals are generated by interpolating the first and second clock signals in response to the offset information.

In accordance with further another aspect of the present invention, there is provided a method of generating delayed tap signals, comprising (a) generating a second tap signal in response to the first and second clock signals and a predetermined offset information, wherein the second tap signal is delayed by a first delay corresponding to the offset information based on a first tap signal; (b) generating a third tap signal in response to the first and second clock signals and the offset information, wherein the third tap signal is delayed by the first delay and a second delay added by the first delay based on the first tap signal; and (c) generating a fourth tap signal in response to the first and second clock signals and the offset information, wherein the fourth tap signal is delayed by the second delay and a third delay added by the first delay based on the third tap signal. Here, the first tap signal is the first clock signal, and the second, third, and fourth signals are generated by interpolating the first and second clock signals in response to the offset information.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which preferred embodiments of the invention are shown. The same reference numerals in different drawings represent the same element.

Figure 2:
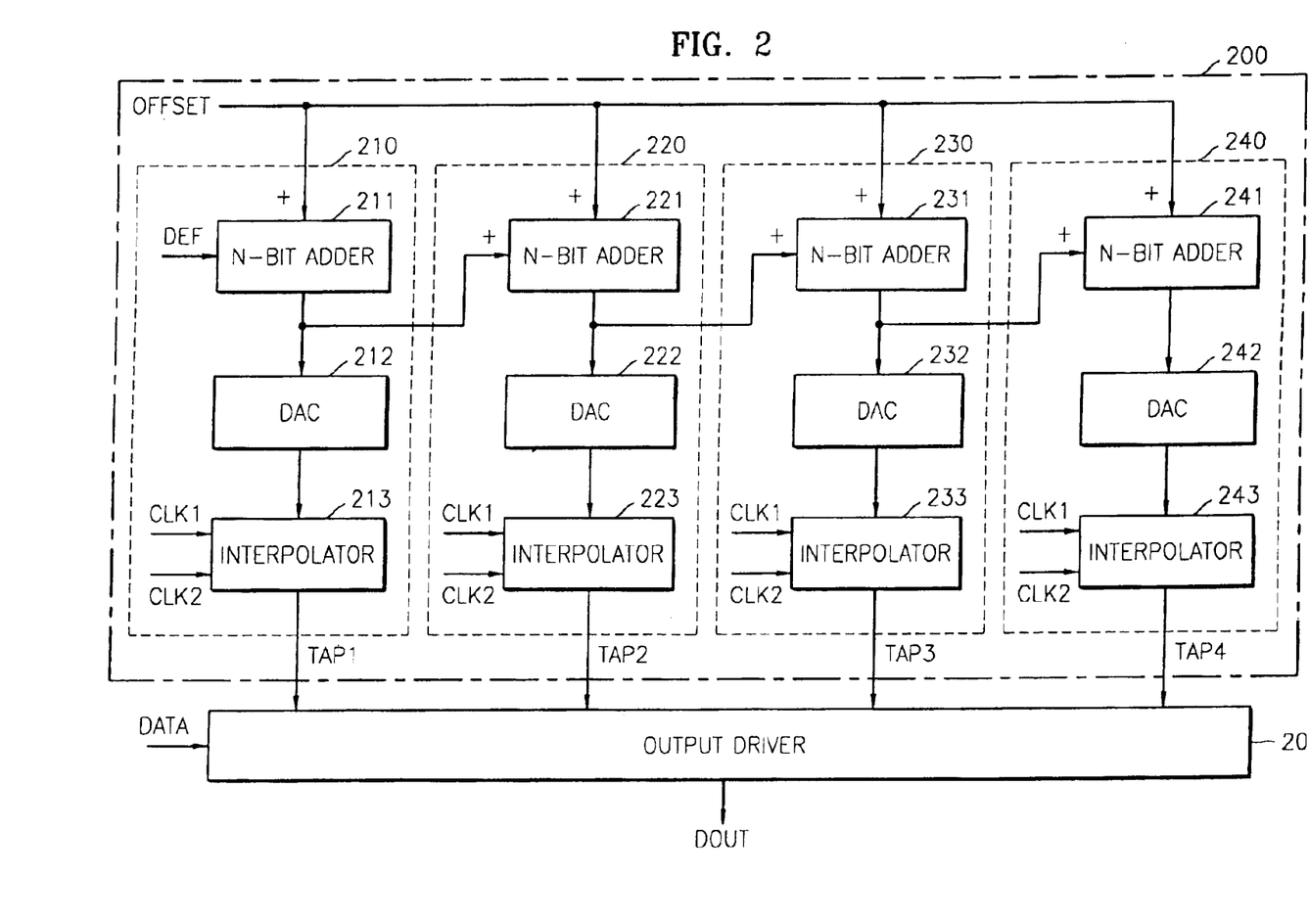
FIG. 2 is a circuit diagram of a delayed tap signal generating circuit according to a first preferred embodiment.

FIG. 2 is a circuit diagram of a delayed tap signal generating circuit according to a first preferred embodiment. A tap signal generating circuit 200 of FIG. 2 generates four tap signals TAP1, TAP2, TAP3, and TAP4 and includes a first tap signal generating circuit 210, a second tap signal generating circuit 220, a third tap signal generating circuit 230, and a fourth tap signal generating circuit 240.

The first tap signal generating circuit 210 includes a first N-bit adder 211, a first digital/analog converting circuit 212, and a first interpolating circuit 213. The first N-bit adder 211 receives offset information, converts the offset information OFFSET into a first N-bit digital signal, adds a predetermined default signal DEF to the N-bit digital signal, and outputs the result as a first N-bit adder output signal. The first digital/analog converting circuit 212 converts the first N-bit adder output signal of the first N-bit adder 211 into a first analog signal and outputs the first analog signal. The first interpolating circuit 213 receives a first clock signal CLK1 and a second clock signal CLK2, interpolates the first and second clock signals CLK1 and CLK2 in response to the first analog signal of the first digital/analog converting circuit 212, and generates a first tap signal TAP1.

The second tap signal generating circuit 220 includes a second N-bit adder 221, a second digital/analog converting circuit 222, and a second interpolating circuit 223. The second N-bit adder 221 receives the offset information OFFSET, converts the offset information OFFSET into a second N-bit digital signal, adds the first N-bit adder output signal of the first N-bit adder 221 to the second N-bit digital signal, and outputs the result as a second N-bit adder output signal. The second digital/analog converting circuit 222 converts the second N-bit adder output signal of the second N-bit adder 221 into a second analog signal and outputs the second analog signal. The second interpolating circuit 223 receives a first clock signal CLK1 and a second clock signal CLK2, interpolates the first and second clock signals CLK1 and CLK2 in response to the second analog signal of the second digital/analog converting circuit 222, and generates a second tap signal TAP2.

The third tap signal generating circuit 230 includes a third N-bit adder 231, a third digital/analog converting circuit 232, and a third interpolating circuit 233. The third N-bit adder 231 receives the offset information OFFSET, converts the offset information OFFSET into a third N-bit digital signal, adds the second N-bit adder output signal of the second N-bit adder 221 to the third N-bit digital signal, and outputs the result as a third N-bit adder output signal. The third digital/analog converting circuit 232 converts the output signal of the third N-bit adder 231 into a third analog signal, and outputs the third analog signal. The third interpolating circuit 233 receives a first clock signal CLK1 and a second clock signal CLK2, interpolates the first and second clock signals CLK1 and CLK2 in response to the third analog signal of the third digital/analog converting circuit 232, and generates a third tap signal TAP3.

The fourth tap signal generating circuit 240 includes a fourth N-bit adder 241, a fourth digital/analog converting circuit 242, and a fourth interpolating circuit 243. The fourth N-bit adder 241 receives the offset information OFFSET, converts the offset information OFFSET into a fourth N-bit digital signal, adds the third N-bit adder output signal of the third N-bit adder 231 to the fourth N-bit digital signal, and outputs the result as a fourth N-bit adder output signal. The fourth digital/analog converting circuit 242 converts the fourth N-bit adder output signal of the fourth N-bit adder 241 into a fourth analog signal, and outputs the fourth analog signal. The fourth interpolating circuit 243 receives a first clock signal CLK1 and a second clock signal CLK2, interpolates the first and second clock signals CLK1 and CLK2 in response to the output signal of the fourth digital/analog converting circuit 242, and generates a fourth tap signal TAP4.

An output driver 20 illustrated in FIG. 2 receives data DATA and outputs the data DATA to externally as DOUT in synchronization with a predetermined clock signal (not shown). The slew rate of the predetermined clock signal (not shown) is adjusted by the plurality of tap signals TAP1, TAP2, TAP3, and TAP4, which are output signals of the delayed tap signal generating circuit 200. The first and second clock signals CLK1 and CLK2 have the same frequency as each other and a predetermined phase difference between them.

Referring to FIG. 2, operations of the delayed tap signal generating circuit 200 will be described hereinafter. In the description to follow, the first, second, third, and fourth N-bit adders 211, 221, 231, and 241 of FIG. 2, N is taken to be equal to 6, but of course could be any convenient value. Each of the tap signal generating circuits 210, 220, 230, and 240 receives predetermined offset information OFFSET. The offset information OFFSET corresponds to a delay difference between output tap signals and is input by the user.

The first N-bit adder 211 converts the offset information OFFSET into a 6-bit digital signal and adds a predetermined default signal DEF to the 6-bit digital signal. The second N-bit adder 221 adds the output signal of the first N-bit adder 211 to the converted 6-bit digital signal, and the third N-bit adder 231 adds the output signal of the second N-bit adder 221 to the converted 6-bit digital signal. The fourth N-bit adder 241 adds the output signal of the third N-bit adder 231 to the converted 6-bit digital signal.

Each of the first, second, third, and fourth digital/analog converting circuits 212, 222, 232, and 242 converts the respective output signals of the first, second, third, and fourth N-bit adders 211, 221, 231, and 241 into analog signals. Each of the first, second, third, and fourth interpolating circuits 213, 223, 233, and 243 interpolates the first and second clock signals CLK1 and CLK2 in response to the respective analog output signals of the first, second, third, and fourth digital/analog converting circuits 212, 222, 232, and 242 and outputs the respective tap signals TAP1, TAP2, TAP3, and TAP4.

The offset information OFFSET corresponds to a delay difference between output tap signals. If a 6-bit adder (N=6) is used, the N-bit adder divides a phase difference between the first and second clock signals CLK1 and CLK2 into $2^6$=64 phases, thereby controlling the delay difference between the output tap signals.

For example, suppose that a delay difference between the first and second clock signals CLK1 and CLK2 is 200 ps, the default signal DEF is 0, and the offset information is 1. Thus, a delay corresponding to the offset information OFFSET becomes 200/64=3.125 ps or a delay difference between output tap signals. If the offset information OFFSET is 2, a delay corresponding to the offset information would be 6.25 ps, etc., etc.

In other words, a delay difference between output tap signals can be adjusted by the input offset information OFFSET. Thus, tap signals having a fine delay difference can be obtained by adjusting the offset information OFFSET.

Figure 3:
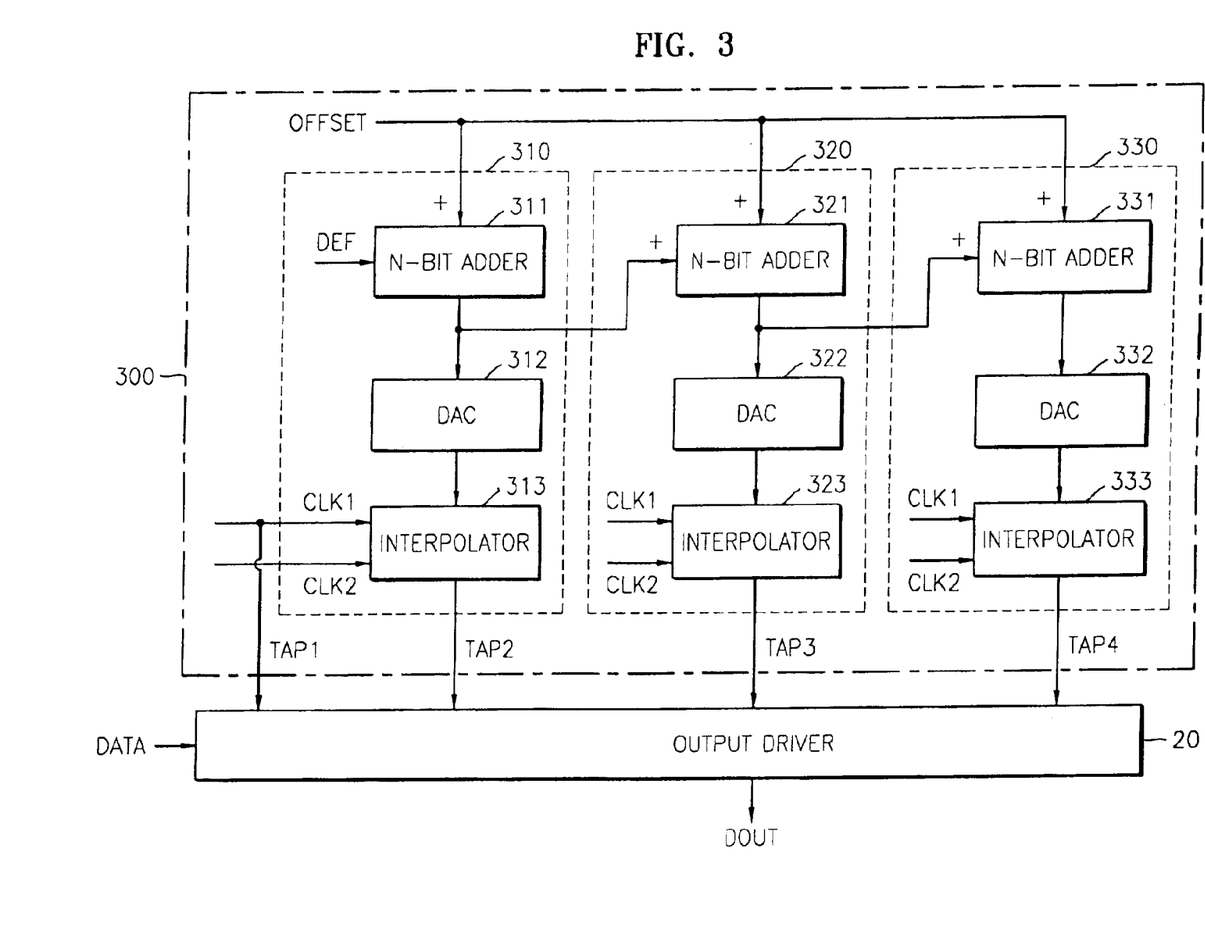
FIG. 3 is a circuit diagram of a delayed tap signal generating circuit according to a second preferred embodiment.

FIG. 3 is a circuit diagram of a delayed tap signal generating circuit according to a second preferred embodiment. The tap signal generating circuit 300 of FIG. 3 outputs four tap signals TAP1, TAP2, TAP3, and TAP4, similarly to FIG. 2. The tap signal generating circuit 300 includes a second tap signal generating circuit 310, a third tap signal generating circuit 320, and a fourth tap signal generating circuit 330.

The second tap signal generating circuit 320 includes a first N-bit adder 311, a first digital/analog converting circuit 312, and a first interpolating circuit 313. The third tap signal generating circuit 320 includes a second N-bit adder 321, a second digital/analog converting circuit 322, and a second interpolating circuit 323. The fourth tap signal generating circuit 330 includes a third N-bit adder 331, a third digital/analog converting circuit 332, and a third interpolating circuit 333.

Each of the N-bit adders 311, 321, and 331, each of the digital/analog converting circuits 312, 322, and 332, and each of the interpolating circuits 313, 323, and 333 have the same connection with each other as the corresponding components of the tap signal generating circuit 200 of FIG. 2. In the tap signal generating circuit 300 of FIG. 3, the first tap signal TAP1 is the first clock signal CLK1.

That is, the first tap signal TAP1 is the first clock signal CLK1, the second tap signal TAP2 is obtained by adding a delay (hereinafter referred to as D1) corresponding to the predetermined offset information OFFSET to the first tap signal TAP1, the third tap signal TAP3 is obtained by adding D1 to the second tap signal TAP2, and the fourth tap signal TAP4 is obtained by adding D1 to the third tap signal TAP3.

Accordingly, like the tap signal generating circuit 200 of FIG. 2, the tap signal generating circuit 300 of FIG. 3 can adjust the delay difference between output tap signals by using the input offset information OFFSET.

Figure 4:
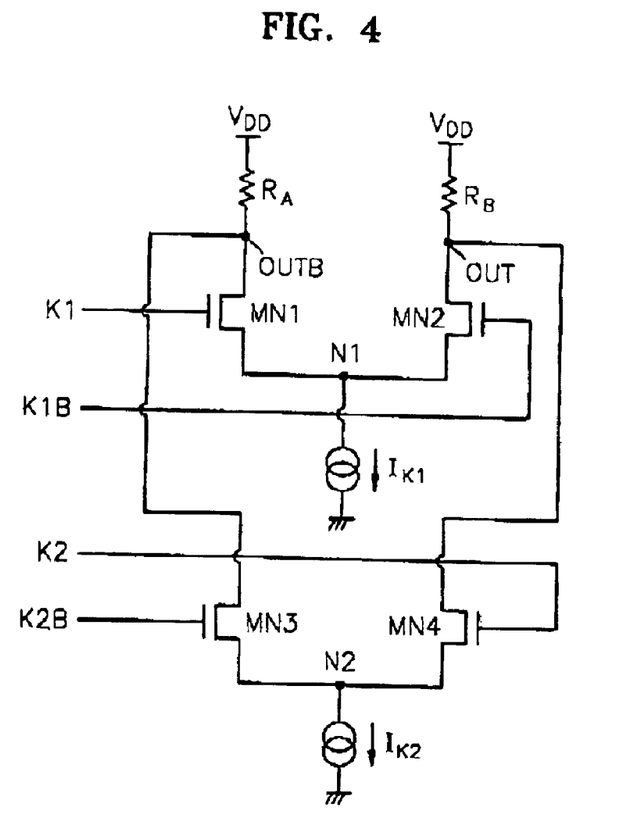
FIG. 4 is a circuit diagram of an example of an interpolating circuit for interpolating input two signals.
Figure 5:
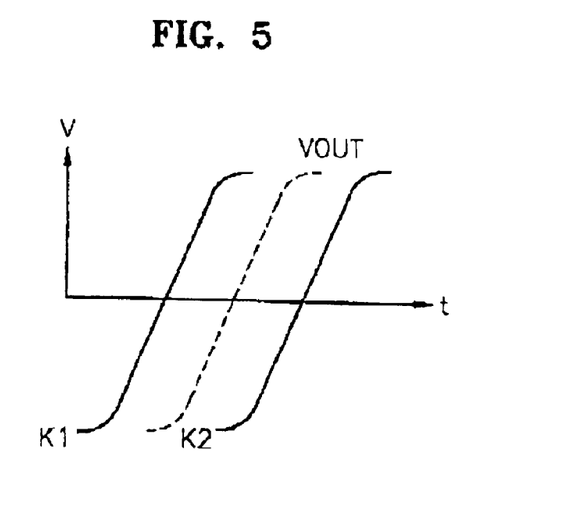
FIG. 5 is a graph showing input and output signals of the interpolating circuit of FIG. 4.

FIG. 4 is a circuit diagram of an example of an interpolating circuit for interpolating two input signals, and FIG. 5 is a graph showing input and output signals of the interpolating circuit of FIG. 4. The interpolating circuit of FIG. 4 includes a plurality of MOS transistors MN1, MN2, MN3, and MN4 as well as current sources $I_{K1}$ and $I_{K2}$, and is formed into a differential arrangement.

A resistor $R_B$ is connected between a power supply voltage $V_{DD}$ and a first output terminal OUT, a resistor $R_A$ is connected between the power supply voltage VDD and a second output terminal OUTB. The MOS transistor MN2 is connected between a first node N1 and the first output terminal OUT, and the MOS transistor MN1 is connected between the first node N1 and the second output terminal OUTB. The current source $I_{K1}$ is connected between the first node N1 and a ground voltage. A first signal K1 is input to a gate of the MOS transistor MN1, and the inverted first signal K1B is input to a gate of the MOS transistor MN2.

The MOS transistor MN4 is connected between the first output terminal OUT and a second node N2, and the MOS transistor MN3 is connected between the second output terminal OUTB and the second node N2. A second signal K2 is input to a gate of the MOS transistor MN4, and the inverted second signal K2B is input to a gate of the MOS transistor MN3.

The interpolating circuit receives the first and second signals K1 and K2 and outputs an intermediate value between the first and second signals K1 and K2. Namely, as illustrated in FIG. 5, the interpolating circuit outputs an output signal VOUT, which is the intermediate value in time between the input two signals K1 and K2. Here, where the output signal VOUT is positioned in time between the two signals K1 and K2, and is controlled by currents of the current sources $I_{K1}$ and $I_{K2}$.

Figure 6:
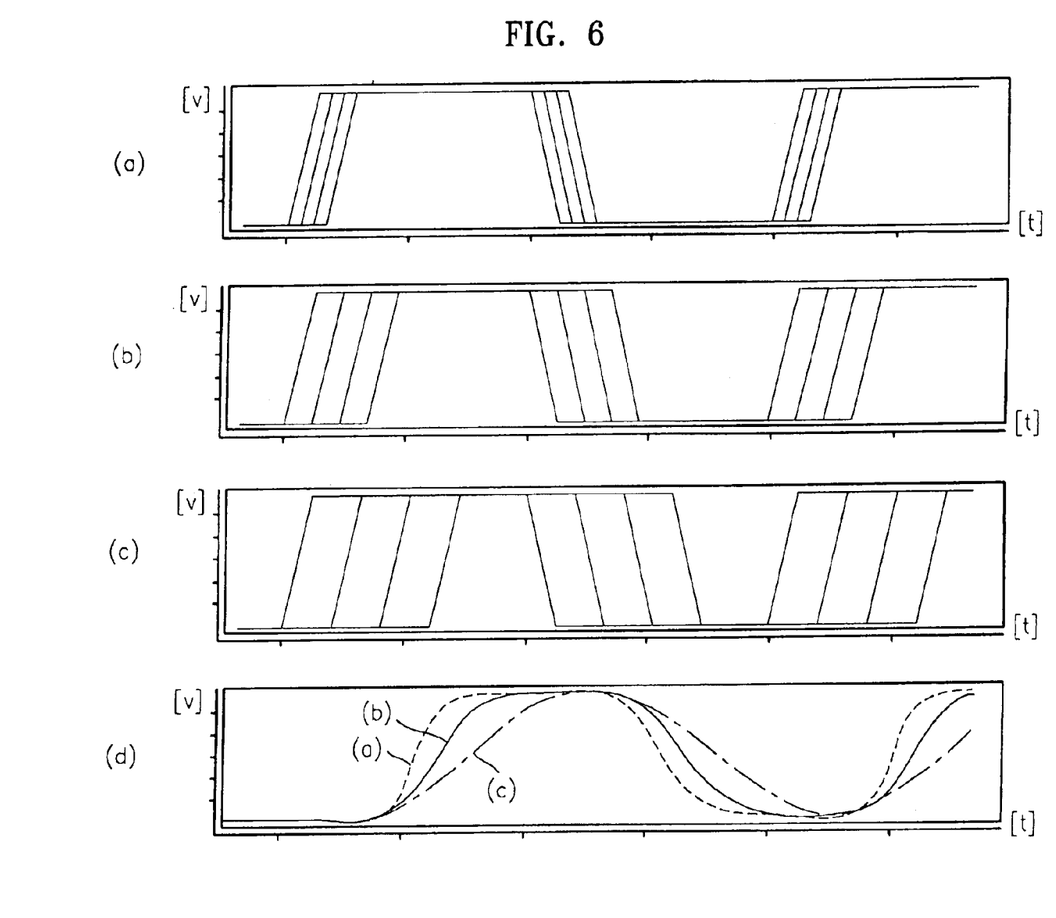
FIGS. 6(a) through 6(c) are graphs showing the output of delayed tap signals having different delays according to offset information.
FIG. 6(d) is a diagram of an output signal of an output driver according to the results of FIGS. 6(a) through 6(c).

FIGS. 6(*a*) through 6(*c*) are graphs showing the output of delayed tap signals having different delays according to offset information, and FIG. 6(*d*) is a diagram of an output signal of an output driver with the output tap signals of FIGS. 6(*a*) through 6(*c*). For each graph, the x-axis represents time, and the y-axis represents voltage (or current).

FIGS. 6(*a*) through 6(*c*) illustrate waveforms of output tap signals. A delay difference between output tap signals is the smallest in FIG. 6(*a*). Conversely, FIG. 6(*c*) illustrates the largest delay difference between the output tap signals.

As illustrated in FIGS. 2 and 3, the tap signal generating circuit outputs tap signals having respective delay differences according to the offset information. FIG. 6(*a*) shows the results produced by the smallest value of the offset information, FIG. 6(*b*) shows the results of an intermediate value of the offset information, and FIG. 6(*c*) shows the results of the largest value of the offset information.

FIG. 6(*d*) shows the relationship between output tap signals of FIGS. 6(*a*) through 6(*c*) and output signals of the output driver. As illustrated in FIG. 6(*d*), when a delay difference between tap signals is small as shown in FIG. 6(*a*), the output signal has a high slew rate. However, when a delay difference between tap signals is large as shown in FIG. 6(*c*), the output signal has a low slew rate.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, although the tap signal generating circuit for generating four tap signals is illustrated in FIGS. 2 and 3, it is merely an example for explaining the concepts of the present invention, and of course the present invention should not be limited thereto. A tap signal generating circuit for generating more than four, or less than four, tap signals does not depart from the scope of the present invention. Also, it would be apparent that the interpolating circuit should be not limited to the embodiment of FIG. 4 and may be embodied in many different forms.

Accordingly, the scope of the present invention should be defined by the following claims.

As set forth above, according to the circuit and method for generating delayed tap signals of the present invention, a delay difference between output tap signals can be adjusted by input offset information. Thus, tap signals having a fine delay difference can be obtained by adjusting the offset information.

What is claimed is:

1. A delayed tap signal generating circuit comprising:
    a first tap signal generating circuit adapted to receive a first clock signal and a second clock signal, which have a same frequency and a phase difference between them, adapted to receive offset information, and adapted to generate a first tap signal in response to the first and second clock signals and the offset information, wherein the first tap signal is delayed with respect to the first clock signal by a first delay corresponding to the offset information; and
    a second tap signal generating circuit adapted to receive the first and second clock signals, adapted to receive the offset information, and adapted to generate a second tap signal in response to the first and second clock signals and the offset information, wherein the second tap signal is delayed with respect to the first clock signal by the first delay and a second delay added to the first delay, wherein the second delay corresponds to the offset information, and
    wherein the first and second tap signals are generated by interpolating the first and second clock signals in response to the offset information.

2. The circuit of claim 1, wherein the first tap generating circuit comprises:
    a first N-bit adder adapted to receive the offset information, convert the offset information into an N-bit digital signal, add a default signal to the N-bit digital signal, and output a first N-bit adder output signal;
    a first digital/analog convening circuit adapted to receive the first N-bit adder output signal, convert the output signal of the first N-bit adder into a first analog signal, and output the first analog signal; and
    a first interpolating circuit adapted to receive the first and second clock signals, interpolate the first and second clock signals in response to the first analog signal, and output the first tap signal.

3. The circuit of claim 2, wherein N is 6.

4. The circuit of claim 2, wherein the second tap signal generating circuit comprises:
    a second N-bit adder adapted to receive the offset information, convert the offset information into a second N-bit digital signal, add the first N-bit adder output signal of the first N-bit adder to the second N-bit digital signal, and output a second N-bit adder output signal;
    a second digital/analog converting circuit adapted to receive the second N-bit adder output signal, convert the second N-bit adder output signal into a second analog signal, and output the second analog signal;
    a second interpolating circuit adapted to receive the first and second clock signals, interpolate the first and second clock signals in response to the second analog signal, and output the second tap signal.

5. The circuit of claim 4, where N is 6.

6. The circuit as claimed in claim 1, wherein the second delay is less than the phase difference between the first and second clock signals.

7. A delayed tap signal generating circuit adapted to receive a first clock signal and a second clock signal, which have the same frequency and a phase difference between them, and adapted to generate a plurality of delayed tap signals, each of which has a delay less than the phase difference, the circuit comprising:
- a second tap signal generating circuit adapted to generate a second tap signal in response to the first and second clock signals and an offset value, wherein the second tap signal is delayed with respect to a first tap signal by a first delay corresponding to the offset value;
- a third tap signal generating circuit adapted to receive the first and second clock signals, and adapted to generate a third tap signal in response to the first and second clock signals and the offset value, wherein third tap signal is delayed with respect to the first tap signal by the first delay and a second delay added to the first delay; and
- a fourth tap signal generating circuit adapted to receive the first and second clock signals, and adapted to generate a fourth tap signal in response to the first and second clock signals and the offset value, wherein the fourth tap signal is delayed with respect to the first tap signal by the first and second delays and a third delay added to the first and second delays,
- wherein the first tap signal is the first clock signal, and
- wherein the second, third, and fourth tap signals are generated by interpolating the first and second clock signals in response to the offset value.

8. The circuit of claim 7, wherein the second tap signal generating circuit comprises:
- a first N-bit adder adapted to receive the offset value, convert the offset value into a first N-bit digital signal, add a default signal to the first N-bit digital signal, and output a first N-bit adder output signal;
- a first digital/analog converting circuit adapted to receive the a first N-bit adder output signal of the first N-bit adder, convert the a first N-bit adder output signal of the first N-bit adder into a first analog signal, and output the first analog signal; and
- a first interpolating circuit adapted to receive the first and second clock signals, interpolate the first and second clock signals in response to the first analog signal, and output the first tap signal.

9. The circuit of claim 8, where N is 6.

10. The circuit of claim 8, wherein the third tap signal generating circuit comprises:
- a second N-bit adder adapted to receive the offset value, convert the offset value into a second N-bit digital signal, add the first N-bit adder output signal of the first N-bit adder to the second N-bit digital signal, and output a second N-bit adder output signal;
- a second digital/analog converting circuit adapted to receive the second N-bit adder output signal of the second N-bit adder, convert the second N-bit adder output signal of the second N-bit adder into a second analog signal, and output the second analog signal; and
- a second interpolating circuit adapted to receive the first and second clock signals, interpolate the first and second clock signals in response to the second analog signal, and output the second tap signal.

11. The circuit of claim 10, where N is 6.

12. The circuit of claim 10, wherein the fourth tap signal generating circuit comprises:
- a third N-bit adder adapted to receive the offset value, convert the offset value into a third N-bit digital signal, add the second N-bit adder output signal of the second N-bit adder to the third N-bit digital signal, and output a third N-bit adder output signal;
- a third digital/analog converting circuit adapted to receive the third N-bit adder output signal of the third N-bit adder, convert the third N-bit adder output signal of the third N-bit adder into a third analog signal, and output the third analog signal; and
- a third interpolating signal adapted to receive the first and second clock signals, interpolate the first and second clock signals in response to the third analog signal, and output the third tap signal.

13. The circuit as claimed in claim 12, wherein N is 6.

14. The circuit as claimed in claim 7, wherein the third delay is less than the phase difference between the first and second clock signals.

15. A method of generating delayed tap signals, the method comprising:
- (a) receiving a first clock signal and a second clock signal, which have the same frequency and a phase difference between them, and receiving offset information, and generating a first tap signal in response to the first and second clock signals and the offset information, wherein the first tap signal is delayed with respect to the first clock signal by a first delay corresponding to the offset information; and
- (b) receiving the first and second clock signals and the offset information and generating a second tap signal in response to the first and second clock signals and the offset information, wherein the second tap signal is delayed with respect to the first clock signal by the first delay and a second delay added to the first delay, wherein the second delay corresponds to the offset information, and
- wherein the first and second tap signals are generated by interpolating the first and second clock signals in response to the offset information.

16. The method as claimed in claim 15, wherein step (a) comprises:
- (a1) receiving the offset information, converting the offset information into a first N-bit digital signal, adding a default signal to the first N-bit digital signal, and outputting a first N-bit adder output signal;
- (a2) converting the first N-bit adder output signal from step (a 1) into a first analog signal and outputting the first analog signal; and
- (a3) receiving the first and second clock signals, interpolating the first and second clock signals in response to the first analog signal from step (a2), and outputting the first tap signal.

17. The method as claimed in claim 16, wherein step (b) comprises:
- (b1) receiving the offset information, converting the offset information into a second N-bit digital signal, adding the first N-bit adder output signal from step (a1) to the second N-bit digital signal, and outputting a second N-bit adder output signal;
- (b2) converting the second N-bit adder output signal from step (b1) into a second analog signal and outputting the second analog signal; and
- (b3) receiving the first and second clock signals, interpolating the first and second clock signals in response to the second analog signal from step (b2), and outputting the second tap signal.

18. The method as claimed in claim 15, wherein the second delay is less than the phase difference between the first and second clock signals.

19. A method of generating delayed tap signals for receiving a first clock signal and a second clock signal, which have the same frequency and a phase difference between them, and generating a plurality of tap signals, each of which has a delay less than the phase difference, the method comprising:

generating a second tap signal in response to the first and second clock signals and an offset value, wherein the second tap signal is delayed with respect to the first clock signal by a first delay corresponding to the offset value;

receiving the first and second clock signals and generating a third tap signal in response to the first and second clock signals and the offset value, wherein the third tap signal is delayed with respect to the first clock signal by the first delay and a second delay added to the first delay; and receiving the first and second clock signals and generating a fourth tap signal in response to the first and second clock signals and the offset value, wherein the fourth tap signal is delayed with respect to the first clock signal by the first and second delays, and a third delay added by the first and second delays, wherein the first tap signal is the first clock signal, and wherein the second, third, and fourth tap signals are generated by interpolating the first and second clock signals in response to the offset value.

20. The method of claim 19, further comprising receiving the offset value input by a user.

* * * * *